(12) United States Patent
Baik

(10) Patent No.: US 11,948,913 B2
(45) Date of Patent: Apr. 2, 2024

(54) SEMICONDUCTOR PACKAGE INCLUDING A DUMMY PAD

(71) Applicant: Samsung Electronics Co., Ltd., Suwon-si (KR)

(72) Inventor: Seunghyun Baik, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 154 days.

(21) Appl. No.: 17/519,917

(22) Filed: Nov. 5, 2021

(65) Prior Publication Data

US 2022/0328453 A1 Oct. 13, 2022

(30) Foreign Application Priority Data

Apr. 8, 2021 (KR) .................... 10-2021-0045734

(51) Int. Cl.
*H01L 25/065* (2023.01)
*H01L 23/00* (2006.01)

(52) U.S. Cl.
CPC .......... *H01L 25/0652* (2013.01); *H01L 24/05* (2013.01); *H01L 24/06* (2013.01); *H01L 24/32* (2013.01); *H01L 24/48* (2013.01); *H01L 24/49* (2013.01); *H01L 24/73* (2013.01); *H01L 24/33* (2013.01); *H01L 24/45* (2013.01); *H01L 2224/05541* (2013.01); *H01L 2224/05553* (2013.01); *H01L 2224/05554* (2013.01); *H01L 2224/05624* (2013.01); *H01L 2224/0569* (2013.01); *H01L 2224/0603* (2013.01); *H01L 2224/06051* (2013.01); *H01L 2224/06165* (2013.01); *H01L 2224/06515* (2013.01); *H01L 2224/32013* (2013.01); *H01L 2224/32145* (2013.01); *H01L 2224/32225* (2013.01); *H01L 2224/33181* (2013.01); *H01L 2224/45139* (2013.01); *H01L 2224/45144* (2013.01); (Continued)

(58) Field of Classification Search
CPC ..... H10B 80/00; H01L 25/0652; H01L 24/05; H01L 24/06; H01L 24/32; H01L 24/48; H01L 24/49; H01L 24/73
USPC ........................................................ 257/686
See application file for complete search history.

(56) References Cited

U.S. PATENT DOCUMENTS 7,868,113 B2   1/2011  Dershem
9,177,886 B2   11/2015 Ko et al.
(Continued)

FOREIGN PATENT DOCUMENTS

JP   5029308 B2   9/2012
JP   5166716 B2   3/2013
(Continued)

*Primary Examiner* — Jasmine J Clark
(74) *Attorney, Agent, or Firm* — Muir Patent Law, PLLC

(57) ABSTRACT

A semiconductor package according to the exemplary embodiments of the disclosure includes a base substrate including a base bonding pad, a first semiconductor chip disposed on the base substrate, a first adhesive layer provided under the first semiconductor chip, a first bonding pad provided in a bonding region on an upper surface of the first semiconductor chip, a first bonding wire interconnecting the base bonding pad and the first bonding pad, and a crack preventer provided in a first region at the upper surface of the first semiconductor chip. The crack preventer includes dummy pads provided at opposite sides of the first region and a dummy wire interconnecting the dummy pads.

20 Claims, 9 Drawing Sheets

(52) U.S. Cl.
CPC ............. *H01L 2224/45147* (2013.01); *H01L 2224/48101* (2013.01); *H01L 2224/48106* (2013.01); *H01L 2224/48132* (2013.01); *H01L 2224/48227* (2013.01); *H01L 2224/48463* (2013.01); *H01L 2224/49111* (2013.01); *H01L 2224/49175* (2013.01); *H01L 2224/73215* (2013.01); *H01L 2224/73265* (2013.01)

(56) References Cited

U.S. PATENT DOCUMENTS

| | | | |
|---|---|---|---|
| 2014/0061887 | A1 | 3/2014 | Okuda et al. |
| 2015/0298966 | A1* | 10/2015 | Bowles ................ B81B 7/02 |
| | | | 438/51 |
| 2021/0066249 | A1* | 3/2021 | Niwa ................ H01L 24/92 |

FOREIGN PATENT DOCUMENTS

| | | | |
|---|---|---|---|
| JP | 2014049733 | A | 3/2014 |
| KR | 19920010798 | A | 6/1992 |
| KR | 20080084300 | A | 9/2008 |

\* cited by examiner

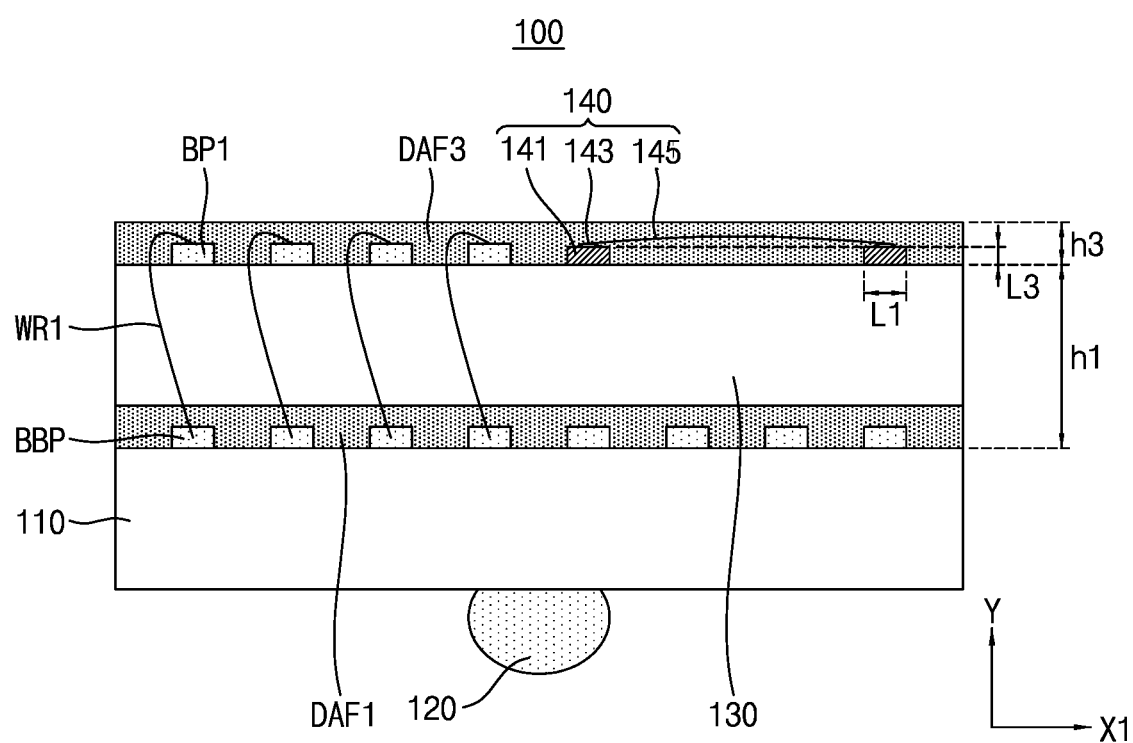

SEMICONDUCTOR PACKAGE INCLUDING A DUMMY PAD

CROSS-REFERENCE TO THE RELATED APPLICATION

This application claims priority from Korean Patent Application No. 10-2021-0045734, filed on Apr. 8, 2021, in the Korean Intellectual Property Office, the disclosure of which is incorporated herein by reference in its entirety.

BACKGROUND

1. Field

The exemplary embodiments of the disclosure relate to a semiconductor package including a dummy pad.

2. Description of the Related Art

Research on various semiconductor packages capable of mounting a plurality of semiconductor chips therein is being conducted. The size of a semiconductor package may be standardized in accordance with industrial standards. It is advantageous to mount as many semiconductor chips as possible in a semiconductor package having a limited size in terms of high integration and an increase in operation speed.

A semiconductor package having a dolmen structure in which a NAND chip is disposed on an upper side, and a controller is disposed under the NAND chip has been realized and, as such, a semiconductor package having a large capacity while having a small size has been realized. The controller may be bonded to a base substrate through wire bonding. Such wire bonding may be conducted at a first portion of a side surface of the controller. In a second portion of the side surface of the controller, no bonding wire may be disposed. A molding layer may penetrate the second portion (i.e., the portion of the side surface of the controller where no bonding wire is disposed) thereby resulting in a buildup of the molding layer at the second portion of the controller. Such a buildup of the molding layer may adversely affect reliability of the semiconductor package by, for example, causing stress and cracks in the semiconductor package.

In order to prevent such penetration of the molding layer, in the exemplary embodiments of the disclosure, a dummy pad and a dummy wire are disposed in a region where no wire bonding is conducted from among regions around the controller.

SUMMARY

The exemplary embodiments of the disclosure provide a semiconductor package having enhanced reliability.

A semiconductor package according to an exemplary embodiment of the disclosure includes a base substrate including a base bonding pad, a first semiconductor chip disposed on the base substrate, a first adhesive layer provided under the first semiconductor chip, a first bonding pad provided in a bonding region on an upper surface of the first semiconductor chip, a first bonding wire interconnecting the base bonding pad and the first bonding pad, and a crack preventer provided in a first region at the upper surface of the first semiconductor chip. The crack preventer includes dummy pads provided at opposite sides of the first region, and a dummy wire interconnecting the dummy pads.

A semiconductor package according to an exemplary embodiment of the disclosure includes a base substrate including a base bonding pad, a first semiconductor chip disposed on the base substrate, a first adhesive layer provided under the first semiconductor chip, a first bonding pad provided in a bonding region on an upper surface of the first semiconductor chip, a first bonding wire interconnecting the base bonding pad and the first bonding pad, a dummy pad provided in a first region at the upper surface of the first semiconductor chip, a second semiconductor chip disposed at opposite sides of the first semiconductor chip, a second adhesive layer disposed under the second semiconductor chip, a semiconductor stack disposed on the first semiconductor chip, and a third adhesive layer disposed under the semiconductor stack. A height of the dummy pad is not greater than a height of the third adhesive layer.

A semiconductor package according to an exemplary embodiment of the disclosure includes a base substrate including a base bonding pad, an external connecting terminal disposed under the base substrate, a first semiconductor chip disposed on the base substrate, a first adhesive layer provided under the first semiconductor chip, a first bonding pad provided in a bonding region on an upper surface of the first semiconductor chip, a first bonding wire interconnecting the base bonding pad and the first bonding pad, a crack preventer provided in a first region at the upper surface of the first semiconductor chip, a second semiconductor chip disposed at opposite sides of the first semiconductor chip, a second adhesive layer disposed under the second semiconductor chip, a second bonding pad provided on an upper surface of the second semiconductor chip, a second bonding wire interconnecting the base bonding pad and the second bonding pad, a semiconductor stack disposed on the first semiconductor chip, the semiconductor stack including a plurality of third semiconductor chips, a third adhesive layer disposed under the plurality of third semiconductor chips, a third bonding pad provided on an upper surface of the plurality of third semiconductor chips, a third bonding wire interconnecting the base bonding pad and the third bonding pad, and a first molding layer disposed between the first semiconductor chip and the second semiconductor chip, and a second molding layer disposed on the base substrate while covering an outward-facing side surface of the second semiconductor chip, a side surface of the semiconductor stack and an upper surface of the semiconductor stack. The crack preventer includes dummy pads provided at opposite sides of the first region, and a dummy wire interconnecting the dummy pads. A height of the third adhesive layer is greater than a height of the dummy pads.

BRIEF DESCRIPTION OF THE DRAWINGS

The above and other objects, features, and advantages of the inventive concept will become more apparent to those skilled in the art upon consideration of the following detailed description with reference to the accompanying drawings.

FIG. 1C is a cross-sectional view of the semiconductor package taken along line I-I' in FIG. 1B.

DETAILED DESCRIPTION OF EXEMPLARY EMBODIMENTS

Figure 1A:
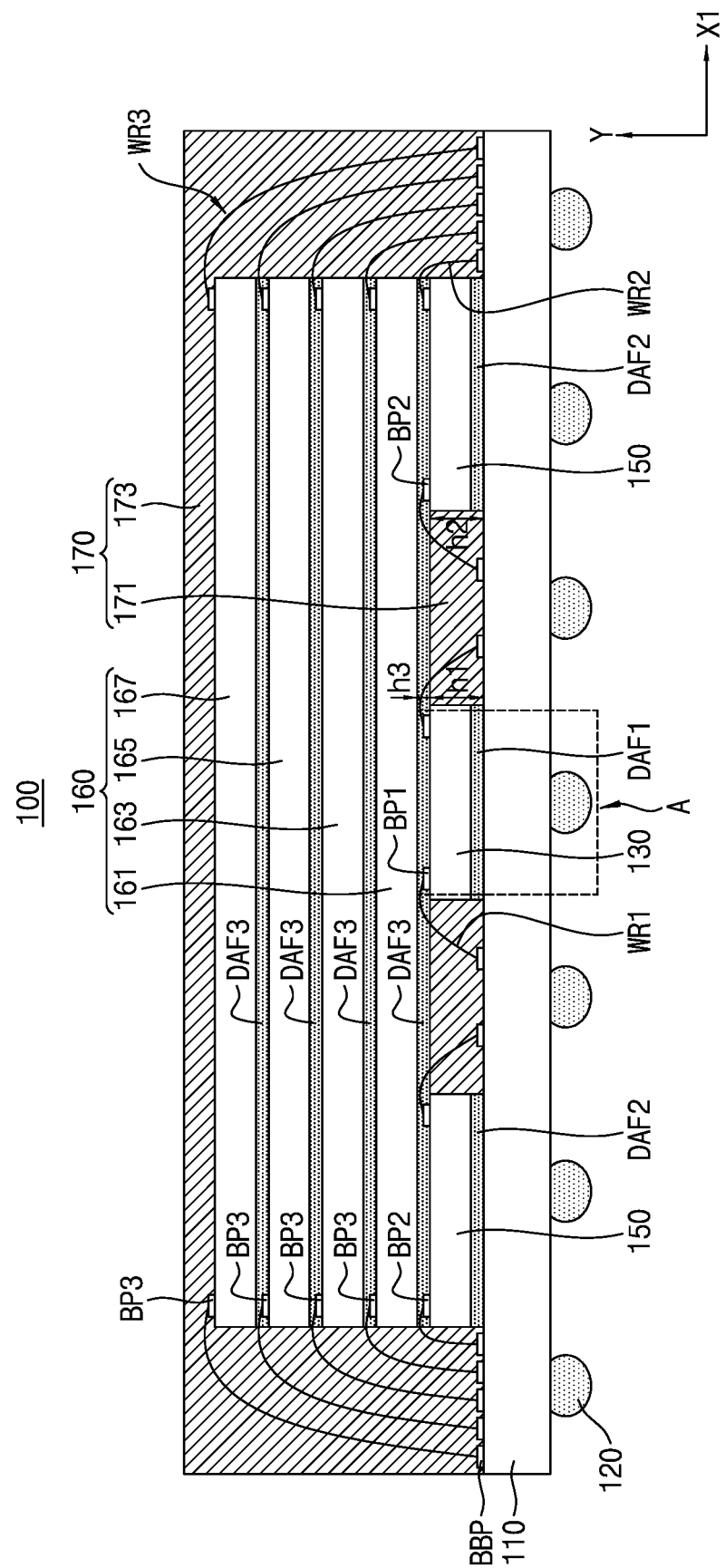
FIG. 1A is a cross-sectional view of a semiconductor package according to an example embodiment of the inventive concepts.
Figure 1B:
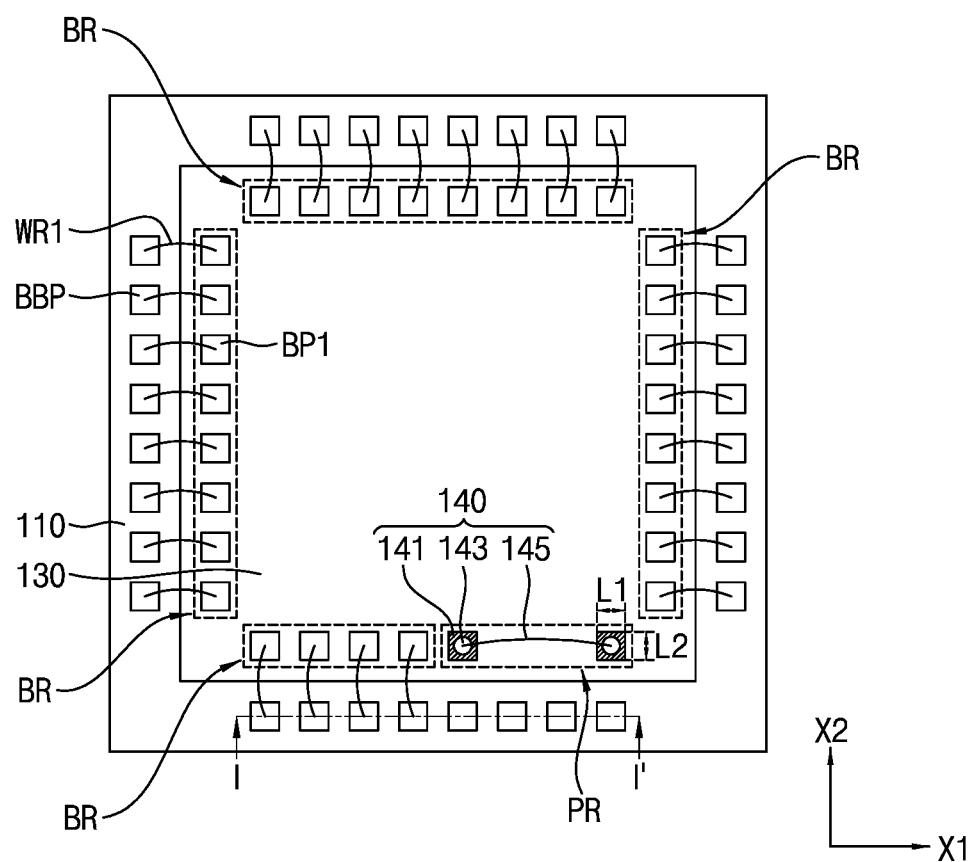
FIG. 1B is a plan view of a portion A of the semiconductor package of FIG. 1A.

FIG. 1A is a cross-sectional view of a semiconductor package according to an example embodiment of the inventive concepts. FIG. 1B is a plan view of a portion A of the semiconductor package of FIG. 1A. FIG. 1C is a cross-sectional view of the semiconductor package taken along line I-I' in FIG. 1B.

Referring to FIGS. 1A to 1C, a semiconductor package 100 may include a base substrate 110, an external connecting terminal 120, a first semiconductor chip 130, a crack preventer 140, second semiconductor chips 150, a semiconductor stack 160, and a molding layer 170.

The base substrate 110 may be a printed circuit board (PCB). The printed circuit board (PCB) may be a multilayer circuit board including a via and various circuits therein. For example, the base substrate 110 may be a rigid printed circuit board, a flexible printed circuit board, or a rigid-flexible printed circuit board.

The external connecting terminal 120 may be disposed under the base substrate 110. An upper surface of the external connecting terminal 120 may contact a lower surface of the base substrate 110. The external connecting terminal 120 may be electrically connected to the base substrate 110. For example, the external connecting terminal 120 may be a solder ball. The external connecting terminal 120 may include or may be formed of at least one of tin and lead. The term "contact," as used herein, refers to a direct connection (i.e., touching) unless the context indicates otherwise. For example, it will be understood that when an element is referred to as "contacting" or "in contact with" another element, or being "directly connected" or "directly coupled" to another element, there are no intervening elements present at the point of contact. In contrast, when an element is referred to as being "connected" or "coupled" to or "on" another element, it can be directly connected or coupled to or on the other element or intervening elements may be present.

As used herein, components described as being "electrically connected" are configured such that an electrical signal can be transferred from one component to the other (although such electrical signal may be attenuated in strength as it transferred and may be selectively transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

Base bonding pads BBP may be provided on the base substrate 110. The base bonding pads BBP may be provided in regions adjacent to the first and second semiconductor chips 130 and 150. A lower surface of each base bonding pad BBP may contact an upper surface of the base substrate 110. The base bonding pad BBP may be electrically connected to the base substrate 110. For example, the base bonding pad BBP may include or may be formed of a conductive material such as copper, aluminum, tungsten, or a combination thereof.

The first semiconductor chip 130 may be mounted on the base substrate 110. The first semiconductor chip 130 may be disposed at a central portion of the base substrate 110. The first semiconductor chip 130 may be spaced apart from the base substrate 110 in a vertical direction Y. The first semiconductor chip 130 may include an integrated circuit. For example, the first semiconductor chip 130 may be a logic chip including a logic circuit. The logic chip may be a controller for controlling memory chips.

A first adhesive layer DAF1 may be provided under the first semiconductor chip 130. The first semiconductor chip 130 may be attached to the upper surface of the base substrate 110 through the first adhesive layer DAF1. For example, the first adhesive layer DAF1 may be an adhesive film such as a direct adhesive film (DAF). DAF may be an ultra-thin adhesive film used in interconnection of a semiconductor chip and a circuit board or interconnection of semiconductor chips in a semiconductor package process. DAF1 may include a component of a pressure-sensitive adhesive or a general-used adhesive. For example, DAF1 may include or may be formed of at least one of epoxy, polyamide, acryl, and polyimide. In another example, DAF1 may include or may be formed of at least one of acryl, vinyl acetate, ethylene-vinyl acetate copolymer, ethylene-acrylic acid ester copolymer, polyamide, polyethylene, polysulfone, epoxy, polyimide, polyamic acid, silicon phenol rubber polymer, fluorine rubber polymer, and fluorine resin. A sum h1 of the height of the first semiconductor chip 130 and the height of the first adhesive layer DAF1 may be 0.5 mm or less.

Although the first semiconductor chip 130 is shown as including only one semiconductor chip, the first semiconductor chip 130 may be a semiconductor stack in which plural semiconductor chips are stacked in a vertical direction (i.e., the Y direction as illustrated in FIG. 1A). For example, the first semiconductor chip 130 may be a semiconductor stack in which two or more semiconductor chips are stacked. In this case, the first adhesive layer DAF1 may be provided among the plurality of semiconductor chips, and the plurality of semiconductor chips may be sequentially attached to the base substrate 110 through the first adhesive layer DAF1.

A plurality of first bonding pads BP1 may be provided on the first semiconductor chip 130. The first bonding pads BP1 may be provided in bonding regions BP which are regions of an edge portion of an upper surface of the first semiconductor chip 130, except for a penetration region PR. The bonding regions BR may be regions adjacent to four side surfaces of the first semiconductor chip 130, respectively. The bonding regions BR may extend along the four side surfaces of the first semiconductor chip 130, respectively. A region in which the molding layer 170 is likely to penetrate between semiconductor chips (e.g., between the first semiconductor chip 130 and the third semiconductor chip 161) during a semiconductor process may be referred to as a penetration region PR (e.g., a first region). The penetration region PR may be a region among the bonding regions BR. The penetration region PR may be a region adjacent to one side surface of the first semiconductor chip 130. The penetration region PR and the bonding region BR may extend along one side surface of the first semiconductor chip 130. For example, as shown in FIG. 1B, the bonding region BR and the penetration region PR, which are adjacent to one side surface of the first semiconductor chip 130, may extend in a first horizontal direction X1. Lower surfaces of the first bonding pads BP1 may contact the upper surface of the first semiconductor chip 130. The first bonding pads BP1 may be electrically connected to the integrated circuit of the first semiconductor chip 130. The base bonding pad BBP and the first bonding pad BP1 may include or may be formed of the same material. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The first semiconductor chip 130 may be electrically connected to the base substrate 110 via first bonding wires WR1. The first semiconductor chip 130 may be wire-bonded to the base substrate 110 through the first bonding wires WR1. The first bonding wires WR1 may interconnect the first bonding pads BP1 and the base bonding pads BBP. For example, the first bonding wires WR1 may include or may be formed of gold, silver, or copper.

The crack preventer 140 may be disposed on the penetration region PR of the first semiconductor chip 130. The crack preventer 140 may include a dummy pad 141, a dummy bump 143, and a dummy wire 145. Dummy pads 141 may be disposed at opposite sides of the penetration region PR of the first semiconductor chip 130. For example, as illustrated in FIG. 1B, a first dummy pad 141 may be disposed on a first side of the penetration region PR along the first horizontal direction X1 and a second dummy pad 141 may be disposed on a second side, opposite to the first side, of the penetration region PR along the first horizontal direction X1. Although an upper surface of the dummy pad 141 is shown as having a square shape in which a length L1 in the first horizontal direction X1 and a length L2 in a second horizontal direction X2 are equal, this is only illustrative. The upper surface of the dummy pad 141 may have a rectangular shape. A height L3 of the dummy pad 141 may be 0.03 to 0.09 mm. For example, the dummy pad 141 may include or may be formed of aluminum or photosensitive polyimide (PSPI). As used herein, the term "dummy" refers to a component that has the same or similar structure and shape as other components but does not does not transmit an electrical signal to a further component. For example, the dummy pad 141, the dummy bump 143, and the dummy wire 145 may be structures that, taken individually or in combination, do not electrically connect the first semiconductor chip 130 to the base substrate 110. While each bonding pad BP1 of the bonding regions BR is configured to transfer signals between the first semiconductor chip 130 and the base substrate 110, each of the dummy pads 141 is not configured to transfer signals between the first semiconductor chip 130 and the base substrate 110.

Dummy bumps 143 and dummy wires 145 may be provided on the dummy pads 141. For example, one dummy bump 143 may be formed on one dummy pad 141. One dummy bump 143 may be formed by forming a free air ball (FAB) at a nozzle end of a capillary (not shown), exposing a wire in the capillary at the nozzle end, melting the exposed wire through application of a high voltage to an end of the capillary, thereby forming a ball, and bonding the formed ball to a dummy pad 141. The dummy wire 145, which interconnects the dummy pads 141, may be formed using the capillary. The dummy bump 143 and the dummy wire 145 may include or may be formed of gold, silver, or copper. The dummy wire 145 may extend in the first horizontal direction X1.

As the semiconductor package 100 includes the crack preventer 140, it may be possible to prevent the molding layer 170 from being unevenly distributed on the first semiconductor chip 130 in a semiconductor manufacturing process.

The second semiconductor chips 150 may be mounted on the base substrate 110. The second semiconductor chips 150 may be disposed at opposite sides of the base substrate 110, respectively. The second semiconductor chips 150 may be spaced apart from the base substrate 110 in the vertical direction Y. Outward-facing side surfaces of the second semiconductor chips 150 may be spaced apart from an outward-facing side surface of the base substrate 110 in the first horizontal direction X1. For example, outward-facing side surfaces of the second semiconductor chips 150 are not aligned with an outward-facing side surface of the base substrate 110 in the vertical direction Y. As used herein, an "outward-facing side surface of the second semiconductor chip 150" refers to a side surface of the second semiconductor chips 150 facing an inward-facing side surface of the molding layer 170 in the first horizontal direction. The second semiconductor chips 150 may be adjacent to and spaced apart from the first semiconductor chip 130 in the first horizontal direction X1. For example, the second semiconductor chips 150 may be dynamic random access memory (DRAM), static random access memory (SRAM), or a combination thereof.

The second semiconductor chips 150 may be attached to the base substrate 110 through a second adhesive layer DAF2. The first adhesive layer DAF1 and the second adhesive layer DAF2 may include or may be formed of the same material. A sum h2 of the height of the second semiconductor chip 150 and the height of the second adhesive layer DAF2 may be equal to a sum h1 of the height of the first semiconductor chip 130 and the height of the first adhesive layer DAF1.

Although not shown, each of the second semiconductor chips 150 may include bonding regions BR and a penetration region PR, identical to the first semiconductor chip 130. In each of the second semiconductor chips 150, a second bonding pad BP2 may be provided in each bonding region BR, and a crack preventer 140 may be provided in the penetration region PR. The second semiconductor chips 150 may be wire-bonded to the base substrate 110 through second bonding wires WR2. The second bonding wires WR2 may interconnect second bonding pads BP2 provided on the second semiconductor chips 150 with the base bonding pads BBP provided on the base substrate 110. The first bonding wire WR1 and the second bonding wire WR2 may include or may be formed of the same material.

Although each of the second semiconductor chips 150 is shown as including only one semiconductor chip, each of the second semiconductor chips 150 may be a semiconductor stack in which plural semiconductor chips are vertically stacked. For example, each of the second semiconductor chips 150 may be a semiconductor stack in which two or more semiconductor chips are stacked. In this case, the second adhesive layer DAF2 may be provided among the plurality of semiconductor chips, and the plurality of semiconductor chips may be sequentially attached to the base substrate 110 through the second adhesive layer DAF2.

The semiconductor stack 160 may be disposed on the first semiconductor chip 130 and the second semiconductor chips 150. The semiconductor stack 160 may be spaced apart from the first semiconductor chip 130 and the second semiconductor chips 150 in the vertical direction Y. Side surfaces of the semiconductor stack 160 may be aligned with the outward-facing side surfaces of the second semiconductor chips 150 in the vertical direction Y.

The semiconductor stack 160 may include a plurality of third semiconductor chips 161, 163, 165, and 167 stacked in the vertical direction Y. The third semiconductor chips 161, 163, 165, and 167 may be spaced apart from one another in the vertical direction Y while overlapping one another. The third semiconductor chips 161, 163, 165, and 167 may include NAND flash memory, magneto-resistive random access memory (MRAM), phase-change random access memory (PRAM), ferroelectric random access memory (Fe-RAM), resistive random access memory (RRAM), X-point random access memory (X-point RAM), or a combination thereof.

A third adhesive layer DAF3 may be provided under each of the third semiconductor chips 161, 163, 165, and 167. The first adhesive layer DAF1, the second adhesive layer DAF2, and the third adhesive layer DAF3 may include or may be formed of the same material as each other.

The third semiconductor chip 161 disposed at a lowermost side from among the third semiconductor chips 161, 163, 165, and 167 may be attached to the first semiconductor chip 130 and the second semiconductor chips 150 through the third adhesive layer DAF3. Adjacent ones of the third semiconductor chips 161, 163, 165, and 167 may be attached to each other by third adhesive layers DAF3 provided among the third semiconductor chips 161, 163, 165, and 167. For example, as illustrated in FIG. 1A, third semiconductor chip 163 is attached to third semiconductor chip 161 through the third adhesive layers DAF3, third semiconductor chip 165 is attached to third semiconductor chip 163 through the third adhesive layers DAF3, and third semiconductor chip 167 is attached to third semiconductor chip 165 through the third adhesive layers DAF3

The third adhesive layer DAF3 provided at a lowermost side from among the third adhesive layers DAF3 may cover the first bonding pads BP1, the second bonding pads BP2, a portion of each first bonding wire WR1, a portion of each second bonding wire WR2, and the crack preventer 140. A height h3 of the third adhesive layer DAF3 may be greater than or equal to a height L3 of the dummy pads 141. For example, the height h3 of the third adhesive layer DAF3 may be 0.031 to 0.1 mm.

The third semiconductor chips 161, 163, 165, and 167 may be wire-bonded to the base substrate 110 through third bonding wires WR3. The first bonding wire WR1, the second bonding wire WR2, and the third bonding wire WR3 may include or may be formed of the same material as each other. The third bonding wires WR3 may interconnect third bonding pads BP3 provided on the third semiconductor chips 161, 163, 165, and 167 to the base bonding pads BBP provided on the base substrate 110.

The molding layer 170 may include first molding portions 171 and a second molding portion 173. Each of the first molding portions 171 and the second molding portion 173 may include or may be formed of an insulating polymer material. For example, each of the first molding portions 171 and the second molding portion 173 may include or may be formed of an epoxy molding compound (EMC).

Each of the first molding portions 171 may be interposed between the first semiconductor chip 130 and a corresponding one of the second semiconductor chips 150. An upper surface of each first molding portion 171 may contact a lower surface of the third adhesive layer DAF3 adjacent thereto. An outward-facing side surface of each first molding portion 171 may contact an inward-facing side surface of the corresponding second semiconductor chip 150. As used herein, an "inward-facing side surface of the second semiconductor chip 150" refers to a side surface of the second semiconductor chip 150 opposite to the outward-facing side surface of the second semiconductor chip 150 in the first horizontal direction. An inward-facing side surface of each first molding portion 171 may contact the first semiconductor chip 130.

Each first molding portion 171 may completely fill a space located around the first semiconductor chip 130 and the corresponding second semiconductor chip 150, and between the lowermost third adhesive layer DAF3 and the base substrate 110. Each first molding portion 171 may cover a part of the first bonding wires WR1 and a part of the second bonding wires WR2 disposed between the first semiconductor chip 130 and the corresponding semiconductor chip 150.

The second molding portion 173 may be disposed on the base substrate 110. An outward-facing side surface of the second molding portion 173 in the vertical direction Y may be aligned with the side surface of the base substrate 110. An inward-facing side surface of the second molding portion 173 may contact the outward-facing side surfaces of the second semiconductor chips 150 and a side surface of the semiconductor stack 160, and may contact an upper surface of the semiconductor stack 160. The second molding portion 173 may cover a part of the third bonding wires WR3 and the third bonding pads BP3 disposed on a top of the semiconductor stack 160.

Figure 2A:
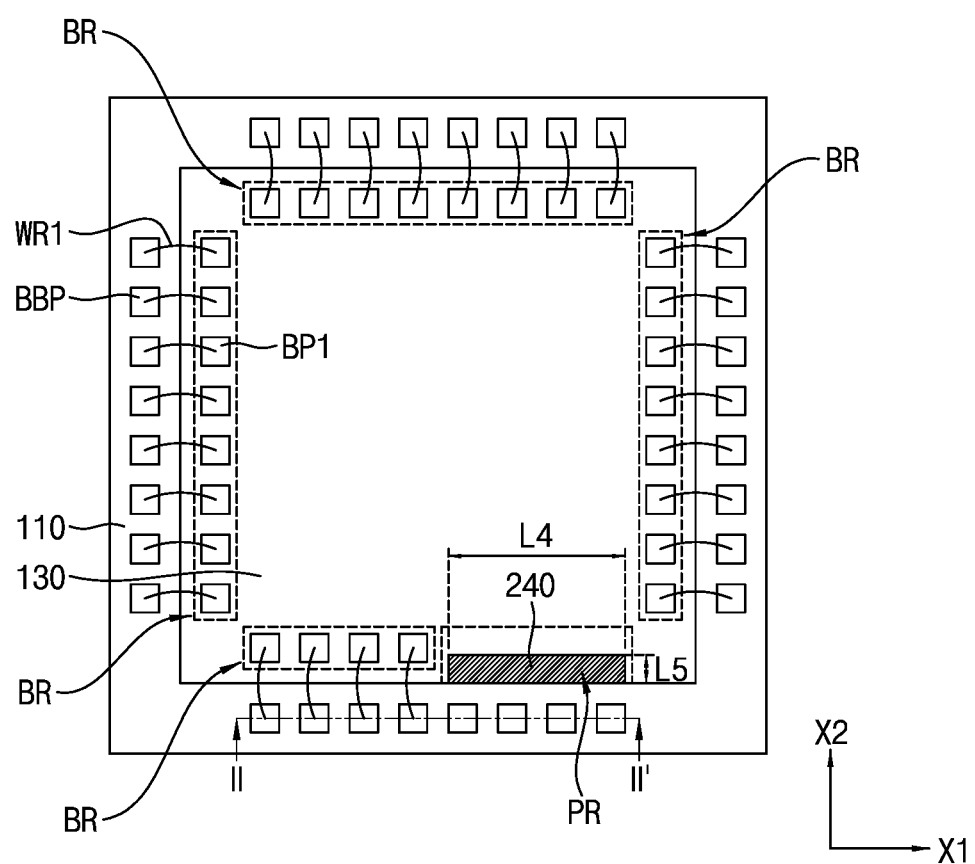
FIG. 2A is a plan view of a semiconductor package according to an example embodiment of the inventive concepts.
Figure 2B:
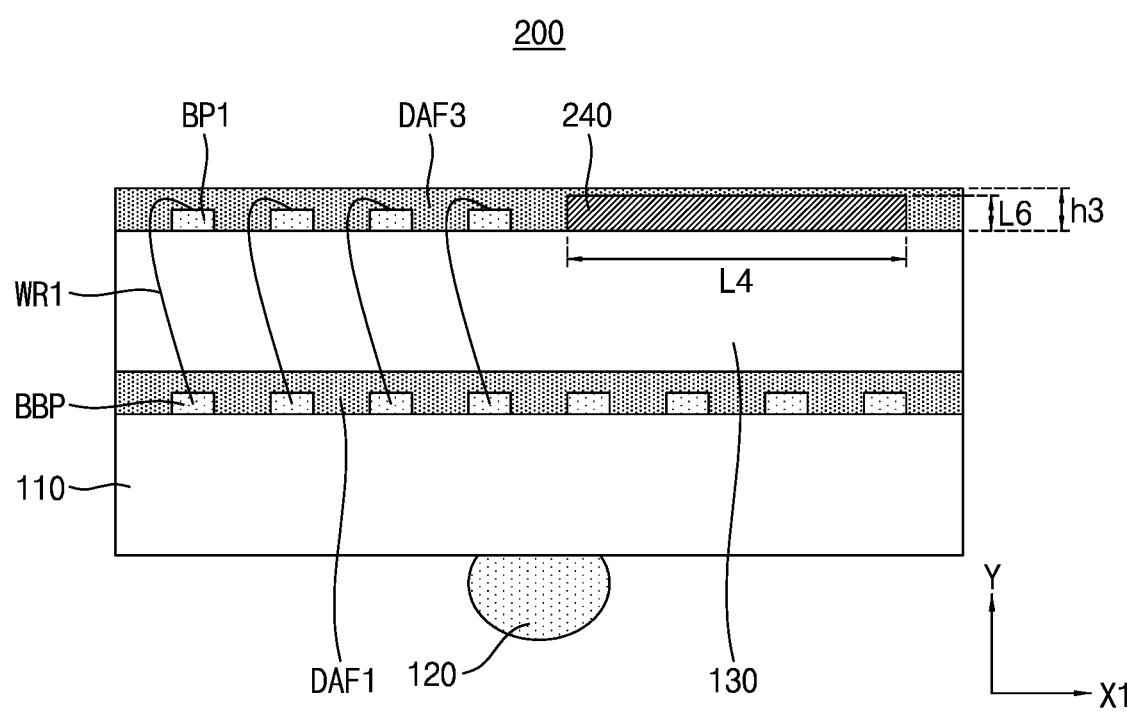
FIG. 2B is a cross-sectional view of the semiconductor package taken along line II-II' in FIG. 2A.

FIG. 2A is a plan view of a semiconductor package 200 according to an example embodiment of the inventive concepts. FIG. 2B is a cross-sectional view of the semiconductor package 200 taken along line II-II' in FIG. 2A.

Referring to FIGS. 2A and 2B, a semiconductor package 200 may include a base substrate 110, an external connecting terminal 120, a first semiconductor chip 130, a crack preventer 240, second semiconductor chips 150, a semiconductor stack 160, and a molding layer 170. Hereinafter, the descriptions to the same components and features as in the above embodiment of the inventive concepts will be omitted for the purpose of ease of explanation and brevity. Differences between the present embodiment of the inventive concepts and the above embodiment will be mainly described.

The crack preventer 240 of the embodiment of the inventive concepts as illustrated in FIGS. 2A and 2B may be constituted by one dummy pad. A length L4 of the crack preventer 240 in a first horizontal direction X1 may be greater than a length L5 of the crack preventer 240 in a second horizontal direction X2. A length L6 of the crack preventer 240 in a vertical direction Y may be equal to a height h3 of a third adhesive layer DAF3 adjacent to the crack preventer 240 or may be smaller than the height h3 of the adjacent adhesive layer DAF3. For example, the length L6 of the crack preventer 240 in the vertical direction Y may be 0.03 to 0.1 mm.

Figure 3:
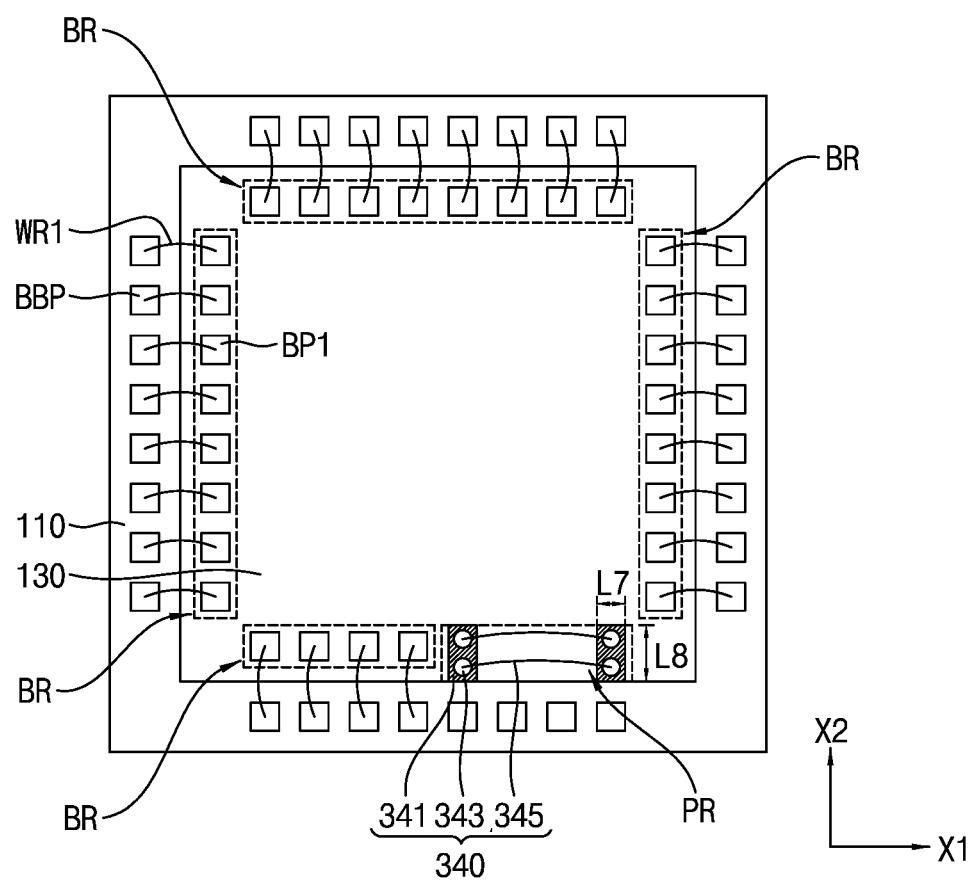
FIG. 3 is a plan view of a semiconductor package according to an example embodiment of the inventive concepts.

FIG. 3 is a plan view of a semiconductor package 300 according to an example embodiment of the inventive concepts.

Referring to FIG. 3, a semiconductor package 300 may include a base substrate 110, an external connecting terminal 120, a first semiconductor chip 130, a crack preventer 340, second semiconductor chips 150, a semiconductor stack 160, and a molding layer 170. Hereinafter, the descriptions to the same components and features as in the above embodiments of the inventive concepts will be omitted for the purpose of ease of explanation and brevity. Differences between the present embodiment of the inventive concepts and the above embodiments will be mainly described.

The crack preventer 340 of the embodiment of the inventive concepts as illustrated in FIG. 3 may include dummy pads 341 disposed at opposite sides of a penetration region PR, a plurality of dummy bumps 343, and a plurality of dummy wires 345. An upper surface of each dummy pad 341 may have a rectangular shape in which a length L8 in a second horizontal direction X2 is greater than a length L7 in a first horizontal direction X1. For example, the length L8 in the second horizontal direction X2 may be 2 or more times the length L7 in the first horizontal direction X1.

The dummy pads 341 may be interconnected through the dummy bumps 343 and the dummy wires 345. Although the drawing shows that two dummy bumps 343 are provided on each dummy pad 341, and two dummy wires 345 are provided, this is only illustrative. An increased number of dummy bumps 343 and an increased number of dummy wires 345 may be provided. For example, when three dummy bumps 343 are provided on each dummy pad 341, three dummy wires 345 may be provided.

Figure 4A:
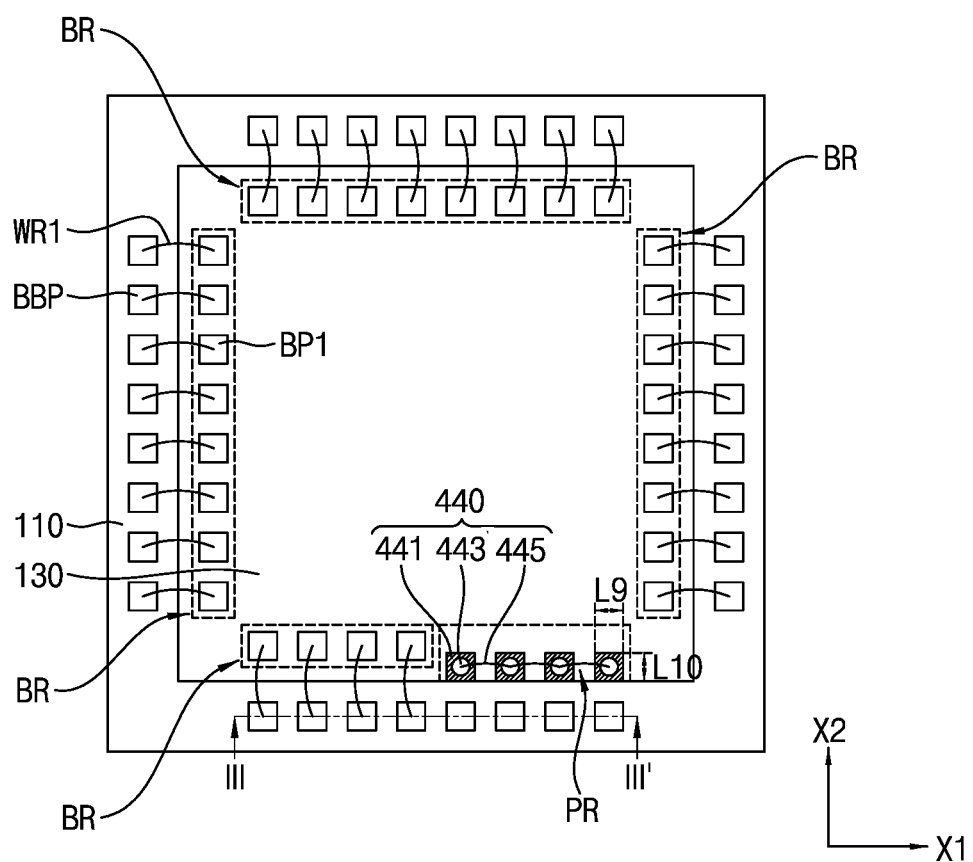
FIG. 4A is a plan view of a semiconductor package according to an example embodiment of the inventive concepts.
Figure 4B:
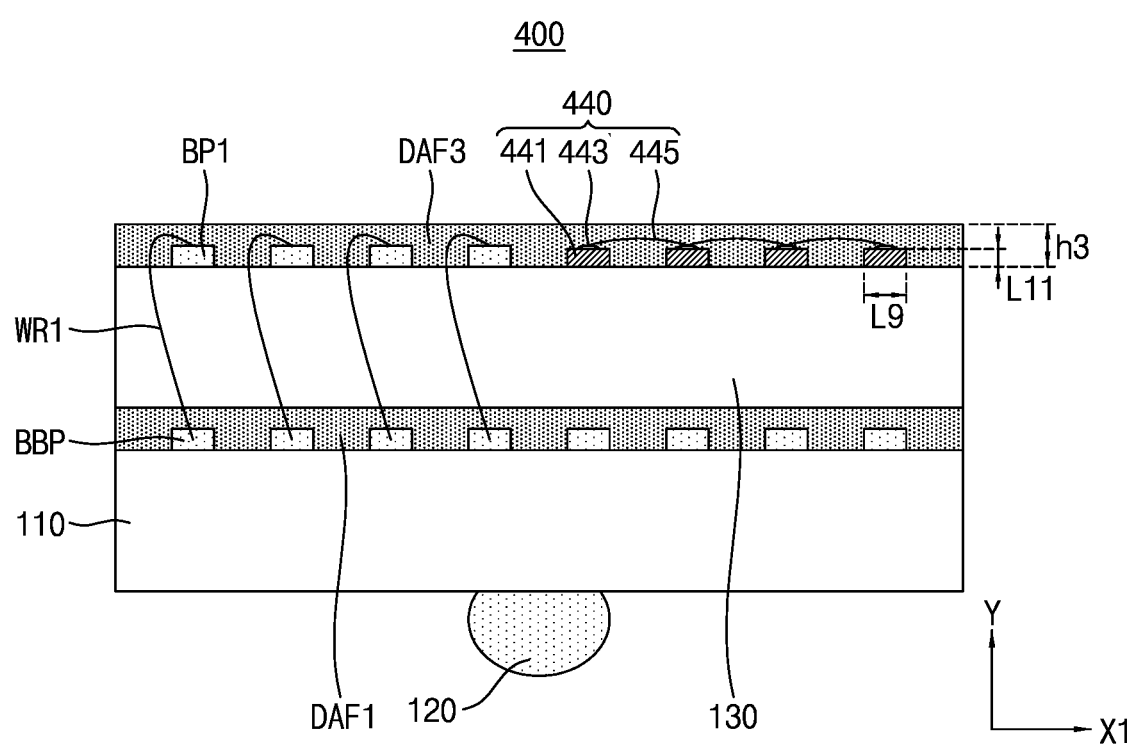
FIG. 4B is a cross-sectional view of the semiconductor package taken along line III-III' FIG. 4A.

FIG. 4A is a plan view of a semiconductor package 400 according to an example embodiment of the inventive concepts. FIG. 4B is a cross-sectional view of the semiconductor package taken along line III-III' FIG. 4A.

Referring to FIGS. 4A and 4B, a semiconductor package 400 may include a base substrate 110, an external connecting terminal 120, a first semiconductor chip 130, a crack preventer 440, second semiconductor chips 150, a semiconductor stack 160, and a molding layer 170. Hereinafter, the descriptions to the same components and features as in the above embodiments of the inventive concepts will be omitted for the purpose of ease of explanation and brevity. Differences between the present embodiment of the inventive concepts and the above embodiments will be mainly described.

The crack preventer 440 of the embodiment of the inventive concepts as illustrated in FIGS. 4A and 4B may include dummy pads 441, dummy bumps 443, and dummy wires 445. Although the drawings show that two dummy pads 441 are provided at opposite sides of a penetration region PR (e.g., a first dummy pad 441 provided on one side of the penetration region PR and a second dummy pad 441 provided at an opposite side of the penetration region PR), and two dummy pads 441 are provided at a central portion of the penetration region PR between the first dummy pad 441 and the second dummy pad 441, this is only illustrative, and the exemplary embodiments of the disclosure are not limited thereto. For example, two dummy pads 441 may be provided at opposite sides of the penetration region PR (e.g., a first dummy pad 441 provided on one side of the penetration region PR and a second dummy pad 441 provided at an opposite side of the penetration region PR), and one dummy pad 441 may be provided at the central portion of the penetration region PR between the first dummy pad 441 and the second dummy pad 441.

Although an upper surface of each dummy pad 441 is shown as having a square shape in which a length L9 in a first horizontal direction X1 and a length L10 in a second horizontal direction X2 are equal, this is only illustrative. The upper surface of the dummy pad 441 may have a rectangular shape. A height L11 of the dummy pad 441 in the vertical direction Y may be 0.03 to 0.09 mm.

The dummy pads 441 may be interconnected through the dummy bumps 443 and the dummy wires 445. Although the drawings show that one dummy wire 445 is provided between adjacent ones of the dummy pads 441, this is only illustrative, and the exemplary embodiments of the disclosure are not limited thereto. For example, a plurality of dummy wires 445 may be provided between the adjacent dummy pads 441. In this case, solder bumps 443 equal in number to the plurality of dummy wires 445 may be provided on each dummy pad 441.

Figure 5:
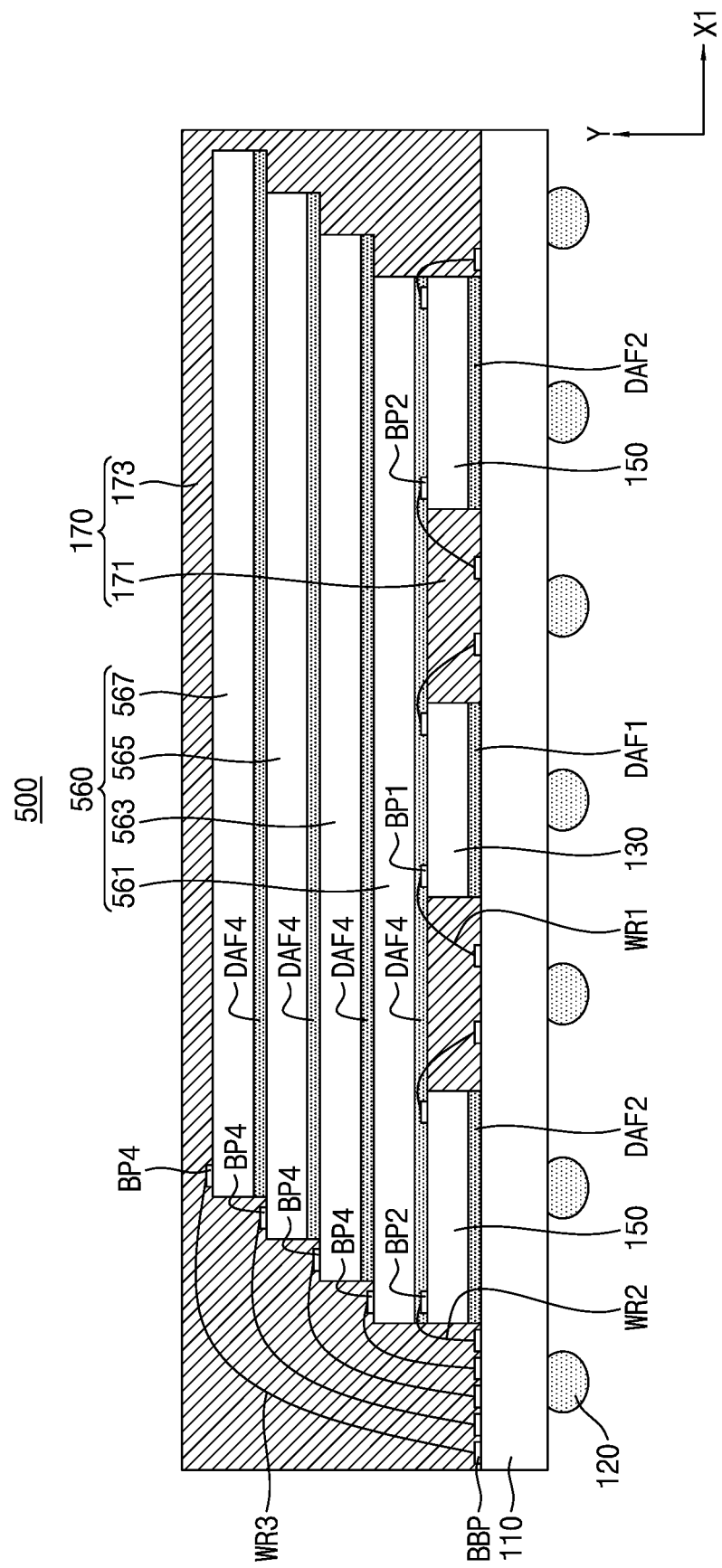
FIG. 5 is a plan view of a semiconductor package according to an example embodiment of the inventive concepts.

FIG. 5 is a plan view of a semiconductor package 500 according to an example embodiment of the inventive concepts.

Referring to FIG. 5, a semiconductor package 500 may include a base substrate 110, an external connecting terminal 120, a first semiconductor chip 130, second semiconductor chips 150, a semiconductor stack 560, and a molding layer 170. Although not shown, the semiconductor package 500 may include one of the above-described crack preventers 140, 240, 340 and 440.

The semiconductor stack 560 may include a plurality of fourth semiconductor chips 561, 563, 565 and 567. The fourth semiconductor chips 561, 563, 565 and 567 may be identical to the third semiconductor chips 161, 163, 165, and 167 of FIGS. 1A to 1C. The fourth semiconductor chips 561, 563, 565 and 567 may be stacked to form a staircase structure. The fourth semiconductor chips 561, 563, 565 and 567 may be stacked in a staircase manner such that fourth bonding pads BP4 at front sides of the fourth semiconductor chips 561, 563, 565 and 567 are exposed. For example, the fourth semiconductor chips 561, 563, 565 and 567 may be stacked in the form of a cascade ascending in a first direction along the first horizontal direction X1 (or descending in a second direction, opposite to the first direction) such that the fourth bonding pad BP4 of each semiconductor chip 561, 563, 565 and 567 is exposed without being covered by the semiconductor chip disposed just above. The exposed fourth bonding pad BP4 of each semiconductor chip 561, 563, 565 and 567 may be electrically connected to the base substrate 110 through a fourth bonding wire WR4.

A fourth adhesive layer DAF4 may be provided under each of the fourth semiconductor chips 561, 563, 565 and 567. The fourth semiconductor chip 561 disposed at a lowermost side from among the fourth semiconductor chips 561, 563, 565 and 567 may be attached to the first semiconductor chip 130 and the second semiconductor chips 150 through the fourth adhesive layer DAF4. Adjacent ones of the fourth semiconductor chips 561, 563, 565 and 567 may be attached to each other by the fourth adhesive layer DAF4 provided among the fourth semiconductor chips 561, 563, 565 and 567. The fourth bonding pad BP4, the fourth bonding wire WR4 and the fourth adhesive layer DAF4 may be identical to the third bonding pad BP3, the third bonding wire WR3 and the third adhesive layer DAF3 of FIGS. 1A to 1C, respectively.

A semiconductor package according to some embodiments of the disclosure may prevent a molding layer from penetrating a semiconductor chip, thereby achieving an enhancement in reliability.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A semiconductor package comprising:
   a base substrate including a first base bonding pad;
   a first semiconductor chip disposed on the base substrate;

a first adhesive layer provided below the first semiconductor chip;
a first bonding pad provided in a bonding region on an upper surface of the first semiconductor chip;
a first bonding wire interconnecting the first base bonding pad and the first bonding pad; and
a crack preventer provided in a first region at the upper surface of the first semiconductor chip,
wherein the crack preventer includes
dummy pads provided at opposite sides of the first region, and
a dummy wire interconnecting the dummy pads.

2. The semiconductor package according to claim 1, further comprising:
a second semiconductor chip provided adjacent to the first semiconductor chip; and
a second adhesive layer provided below the second semiconductor chip.

3. The semiconductor package according to claim 2, further comprising:
a second bonding pad provided on an upper surface of the second semiconductor chip; and
a second bonding wire interconnecting a second base bonding pad and the second bonding pad.

4. The semiconductor package according to claim 2, wherein a sum of a height of the first semiconductor chip and a height of the first adhesive layer is equal to a sum of a height of the second semiconductor chip and a height of the second adhesive layer.

5. The semiconductor package according to claim 4, wherein the sum of the height of the first semiconductor chip and the height of the first adhesive layer is 0.5 mm or less.

6. The semiconductor package according to claim 2, further comprising:
a molding layer provided between the first semiconductor chip and the second semiconductor chip.

7. The semiconductor package according to claim 6, wherein the molding layer includes an epoxy molding compound (EMC).

8. The semiconductor package according to claim 1, further comprising:
a semiconductor stack disposed on the first semiconductor chip; and
a third adhesive layer disposed below the semiconductor stack.

9. The semiconductor package according to claim 8, wherein a height of each of the dummy pads is smaller than a height of the third adhesive layer.

10. The semiconductor package according to claim 9, wherein the height of each of the dummy pads is 0.03 to 0.09 mm.

11. The semiconductor package according to claim 9, wherein the height of the third adhesive layer is 0.03 to 0.1 mm.

12. The semiconductor package according to claim 8, wherein the semiconductor stack includes a plurality of semiconductor chips.

13. The semiconductor package according to claim 1, wherein the crack preventer further includes a plurality of dummy bumps, and
wherein at least one of the plurality of dummy bumps is provided on each of the dummy pads.

14. A semiconductor package comprising:
a base substrate including a first base bonding pad;
a first semiconductor chip disposed on the base substrate;
a first adhesive layer provided below the first semiconductor chip;
a first bonding pad provided in a bonding region on an upper surface of the first semiconductor chip;
a first bonding wire interconnecting the first base bonding pad and the first bonding pad;
a dummy pad provided in a first region on the upper surface of the first semiconductor chip;
second semiconductor chips disposed at opposite sides of the first semiconductor chip;
second adhesive layers disposed below the second semiconductor chips;
a semiconductor stack disposed on the first semiconductor chip and the second semiconductor chips;
a third adhesive layer disposed below the semiconductor stack; and
a molding layer covering the first semiconductor chip, the second semiconductor chips and the semiconductor stack,
wherein a height of the dummy pad is not greater than a height of the third adhesive layer.

15. The semiconductor package according to claim 14, wherein the height of the dummy pad is 0.03 to 0.1 mm.

16. The semiconductor package according to claim 14, wherein the semiconductor stack includes a plurality of third semiconductor chips stacked to have a staircase structure.

17. The semiconductor package according to claim 16, further comprising:
a second bonding pad provided on an upper surface of at least one of the second semiconductor chips;
a second bonding wire interconnecting a second base bonding pad and the second bonding pad;
a third bonding pad provided on an upper surface of at least one of the third semiconductor chips; and
a third bonding wire interconnecting a third base bonding pad and the third bonding pad.

18. A semiconductor package comprising:
a base substrate including a first base bonding pad;
an external connecting terminal disposed below the base substrate;
a first semiconductor chip disposed on the base substrate;
a first adhesive layer provided below the first semiconductor chip;
a first bonding pad provided in a bonding region on an upper surface of the first semiconductor chip;
a first bonding wire interconnecting the first base bonding pad and the first bonding pad;
a crack preventer provided in a first region on the upper surface of the first semiconductor chip;
a second semiconductor chip disposed adjacent to the first semiconductor chip;
a second adhesive layer disposed below the second semiconductor chip;
a second bonding pad provided on an upper surface of the second semiconductor chip;
a second bonding wire interconnecting a second base bonding pad and the second bonding pad;
a semiconductor stack disposed on the first semiconductor chip, the semiconductor stack including a plurality of third semiconductor chips;
a third adhesive layer disposed below the plurality of third semiconductor chips;
a third bonding pad provided on an upper surface of the plurality of third semiconductor chips;
a third bonding wire interconnecting a third base bonding pad and the third bonding pad; and
a molding layer including a first molding portion disposed between the first semiconductor chip and the second semiconductor chip, and a second molding portion disposed on the base substrate while covering an outward-facing side surface of the second semiconductor chip, a side surface of the semiconductor stack and an upper surface of the semiconductor stack, wherein the crack preventer includes dummy pads provided at opposite sides of the first region, and a dummy wire interconnecting the dummy pads, and wherein a height of the third adhesive layer is greater than a height of the dummy pads.

19. The semiconductor package according to claim 18, wherein:
- a sum of a height of the first semiconductor chip and a height of the first adhesive layer is equal to a sum of a height of the second semiconductor chip and a height of the second adhesive layer;
- the height of the third adhesive layer is 0.03 to 0.1 mm; and
- the height of the dummy pads is 0.03 to 0.09 mm.

20. The semiconductor package according to claim 18, wherein the plurality of third semiconductor chips is stacked to have a staircase structure.

* * * * *